United States Patent
Schlomann

(10) Patent No.: US 7,675,167 B2
(45) Date of Patent: Mar. 9, 2010

(54) ELECTRONIC DEVICE PACKAGE HEAT SINK ASSEMBLY

(75) Inventor: Herbert W. Schlomann, Oradell, NJ (US)

(73) Assignee: Electro Ceramic Industries, Hackensack, NJ (US)

( * ) Notice: Subject to any disclaimer, the term of this patent is extended or adjusted under 35 U.S.C. 154(b) by 830 days.

(21) Appl. No.: 11/452,126

(22) Filed: Jun. 13, 2006

(65) Prior Publication Data

US 2006/0279934 A1  Dec. 14, 2006

Related U.S. Application Data

(60) Provisional application No. 60/690,120, filed on Jun. 13, 2005.

(51) Int. Cl.
H01L 23/34 (2006.01)
H01L 23/10 (2006.01)

(52) U.S. Cl. .............. 257/727; 257/704; 257/706; 257/713; 257/E23.101

(58) Field of Classification Search ............ 257/727, 257/706, 704, 713, E23.101
See application file for complete search history.

(56) References Cited

U.S. PATENT DOCUMENTS

| | | | |
|---|---|---|---|
| 4,781,612 A | | 11/1988 | Thrush |
| 4,845,545 A | | 7/1989 | Abramowitz et al. |
| 5,530,376 A | * | 6/1996 | Lim et al. .............. 324/765 |
| 5,621,615 A | * | 4/1997 | Dawson et al. .......... 361/704 |
| 5,945,736 A | * | 8/1999 | Rife et al. .............. 257/719 |
| 6,020,597 A | * | 2/2000 | Kwak ...................... 257/48 |
| 6,072,322 A | * | 6/2000 | Viswanath et al. ...... 324/754 |
| 6,130,821 A | | 10/2000 | Gerber |
| 6,656,754 B1 | | 12/2003 | Farnworth et al. |
| 6,833,566 B2 | | 12/2004 | Suehiro et al. |
| 6,849,942 B2 | * | 2/2005 | Lin et al. ................ 257/712 |
| 7,206,204 B2 | * | 4/2007 | Nakatsu et al. .......... 361/703 |
| 2004/0135247 A1 | | 7/2004 | Takashima et al. |
| 2004/0177985 A1 | * | 9/2004 | Karavakis et al. ....... 174/52.4 |
| 2006/0267182 A1 | * | 11/2006 | Rumer et al. ............ 257/706 |
| 2007/0023879 A1 | * | 2/2007 | Pandey et al. ........... 257/678 |
| 2007/0096297 A1 | * | 5/2007 | Frey ....................... 257/706 |

OTHER PUBLICATIONS

International Search Report dated Feb. 5, 2007 for related PCT Application No. PCT/US06/22877.

* cited by examiner

*Primary Examiner*—Nitin Parekh
(74) *Attorney, Agent, or Firm*—Howard IP Law Group, PC

(57) ABSTRACT

An electronic package includes a flat base having a notch formed at opposite ends of the base. A clamping mechanism has a boss adapted to the notch for matingly connecting to the base, and includes an aperture for receiving a fastener for securing the package to a substrate or heat sink.

20 Claims, 8 Drawing Sheets

ELECTRONIC DEVICE PACKAGE HEAT SINK ASSEMBLY

RELATED APPLICATIONS

This application claims priority of U.S. patent application Ser. No. 60/690,120, entitled ELECTRONIC DEVICE PACKAGE HEAT SINK ASSEMBLY, filed Jun. 13, 2005, the entire disclosure of which is hereby incorporated by reference as if being set forth in its entirety herein.

FIELD OF INVENTION

This invention relates generally to heat dissipation in electronic component packages, and more particularly, to an improved arrangement for enabling contact of an electronic package with a heat sink and for accommodating additional packages within a given area.

BACKGROUND OF THE INVENTION

There are presently available numerous microwave (and other high frequency) devices which operate over a broad band of frequencies for use in a variety of applications. For example, devices such as Gunn devices, avalanche diodes, amplifiers and other such devices operate over a broad band of frequencies in conjunction with various housings to enable these devices to function in a wide variety of applications. Each of these devices can operate to produce different effects. In addition to the above-noted devices, there exist other devices, such as Schottky diodes, which must be mounted in a housing or otherwise securely retained without affecting the performance of such devices.

Electronic and semiconductor device packages, including optical RF and LED packages, circuits and configurations also require positioning in a housing to provide protection from the environment, and/or to enable coupling to heat sinks for large heat dissipation and the like. Such housing must enable the device to operate efficiently and with a minimum amount of interference from the housing configuration, and to minimize matching and complex impedance effects.

Telecommunications in general, and in particular, wireless or cellular communications, require sophisticated and robust electronic devices and components to enable its infrastructure and to facilitate applications for such technologies. For example, cell towers typically include a number of horns (e.g. microwave horns) disposed on the tower and connected via cables to equipment housed within a building supporting the tower (disposed beneath or adjacent the tower). The cables connect each of the horns with the remotely located equipment to carry electronic signals for communication. One drawback of the cabling is an increase in noise and interference along the path of the tower between the equipment and the horn. It is desirable to minimize the cabling required by reducing the size of the electronic hardware so as to enable a structure such as a box or other enclosure containing the electronic equipment to be placed near (e.g. next to) the horns to significantly reduce the cable length (i.e. path length) there between and enable clearer, more efficient communication with reduced interference effects. However, one problem with the current package design is that the electronic devices produce a significant amount of heat which needs to be dissipated for the devices to function properly. Moreover, current designs and methods for securing the devices within a board layout or configuration utilize bolt down screws or holes, which are often too far from the center of the package and which tend to cause a bowing effect. The bowing effect causes contact to be lost, resulting in reduced heat dissipation and increased numbers of device failures and burnout.

An improved structure and method of package design which provides more uniform contact with a heat sink for enabling heat dissipation, while enabling additional device packages to be included within a given area of a substrate, such as a printed circuit board, is highly desired.

SUMMARY

The present invention finds application in numerous packaging assemblies for microwave devices such as various microwave diodes, oscillators, and amplifier devices, as well as for optical devices including light emitting diodes (LEDs) and other optical RF arrangements for various purposes including (but not limited to) intrusion detection, door openers, police radar detectors, microwave communications, cellular telephone and other applications. In one embodiment, the electronic device package of the present invention is a ceramic-to-metal seal used in various electronic device components wherein customers insert a chip into the package, attach wires to the chip and attach a cover, so that the chip is protected from the environment. The present invention allows for better contact to the base plate and includes a clamp down mechanism in place of screws and is positioned closer to the center of the package.

One embodiment of an aspect of the present invention includes a spring pressure clip disposed on the package cover at substantially the center of the package. The package thus requires less material than its predecessors and less cost to manufacture. Prior designs use bolt down screws (holes) which are too far from the center of the package and which cause a bowing effect. In prior designs, the bowing effect causes contact to be lost.

According to another aspect of the invention, an electronic package includes a flat base of reduced length having a notch formed at opposite ends of the base. A clamping mechanism has a locking boss adapted to the notch for matingly connecting to the base, and includes an aperture for receiving a fastener for securing the package to a substrate or heat sink. This novel structure provides enhanced heat dissipation due to improved contact of the base package with the heat sink. The clamping mechanism may be a single ended or multiple ended (e.g. two or more) boss structure. The package including the reduced length base structure and clamping mechanism enables another like electronic package to be disposed adjacent the first package within a reduced area required for each package, thereby allowing additional package placement within a given area while providing enhanced heat dissipation due to improved contact with the heat sink.

According to yet another aspect of the invention, a resilient spring pressure clip is disposed on a cover of an electronic package for providing pressure to a central portion (center) of the package for providing more uniform contact of the package with a substrate for dissipating heat. The spring may be used in conjunction with standard device packages, or with the reduced length base package design and clamping mechanism according to the present invention.

Thus, an electronic device package assembly for coupling to a substrate to dissipate heat comprises a base member having a first surface for carrying an electronic module, a second surface opposite the first surface for engaging a substrate, and first and second opposing ends, each end defining a corresponding notch therein. A first clamp has a body and a first end adapted to matingly couple to one of the corresponding notches; and a second clamp has a body and a first end is adapted to matingly couple to the other one of the corresponding notches of the base member. Each of the first and second clamps includes a through hole formed in the body of the clamp and is aligned with a corresponding through hole in a substrate for receiving a fastener for securing the package assembly to the substrate.

The package assembly may further comprise a protective cover disposed over the electronic module. A spring clip may be coupled to the first and second clamps and includes a central planar segment disposed over the protective cover for providing centralized pressure thereto. The spring clip may be monolithic and comprise a pair of oppositely disposed and laterally extending legs, each leg coupled to the central planar segment by a corresponding protuberance, wherein the laterally extending legs each include a through hole or a portion thereof, such as a semicircular notch, alignable with a corresponding one of the through holes in the substrate for receiving a fastener for securing the spring clip.

Each notch of the base member may include a chamfered edge for engaging a corresponding locking boss on one of the first and second clamps, and may be of a semicircular, V, or wedge shaped configuration. The base preferably comprises a metal such as molybdenum, copper or a combination thereof or a press powdered metal. The first or second clamp may further include a second end opposite the first end and adapted to matingly couple to a corresponding notch of another base member.

A plurality of base members and a plurality of first and second clamps may be configured, wherein each base member is disposed between a corresponding first and a second clamp in a row like configuration.

In one embodiment, interposed between two successive base members is a single first clamp or second clamp. In another embodiment, interposed between two successive base members are both a first clamp and a second clamp. The plurality of base members preferably are identical, as are the plurality of first and second clamps in terms of size dimensions. The electronic module may comprise a semiconductor circuit a light emitting diode or other such electronic chip.

BRIEF DESCRIPTION OF THE FIGURES

Understanding of the present invention will be facilitated by consideration of the following detailed description of the preferred embodiments of the present invention taken in conjunction with the accompanying drawings, in which like numerals refer to like parts and in which.

DETAILED DESCRIPTION OF EMBODIMENTS OF THE INVENTION

It is to be understood that the figures and descriptions of the present invention have been simplified to illustrate elements that are relevant for a clear understanding of the present invention, while eliminating, for purposes of clarity, many other elements found in typical electronic device or semiconductor package designs and methods of making and using the same. However, because such elements are well known in the art, and because they do not facilitate a better understanding of the present invention, a discussion of such elements is not provided herein. The disclosure herein is directed to all such variations and modifications known to those skilled in the art.

Figure 1A:
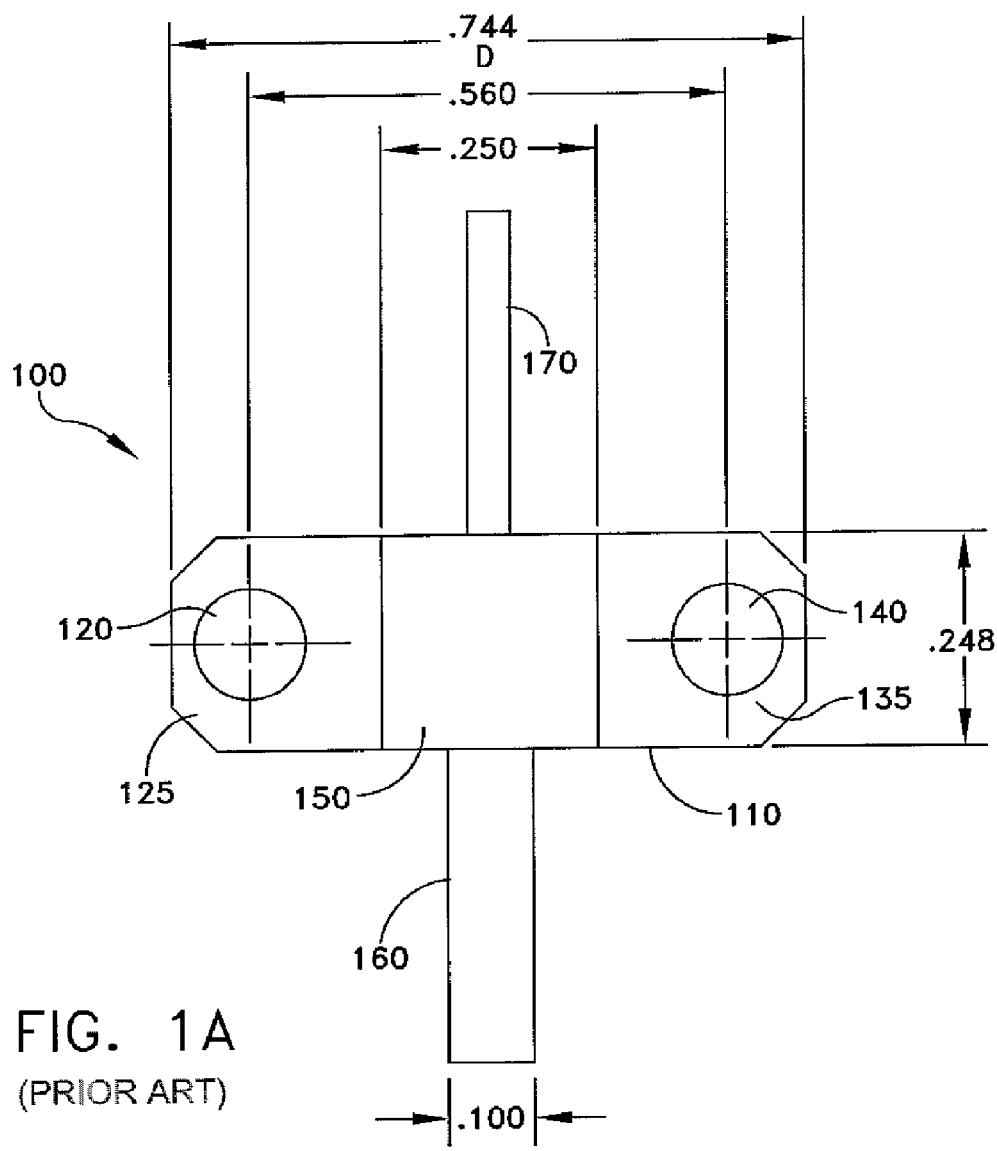
FIG. 1A-B are top and side views, respectively, of a standard semiconductor package useful in implementing aspects of the present invention.
Figure 1B:
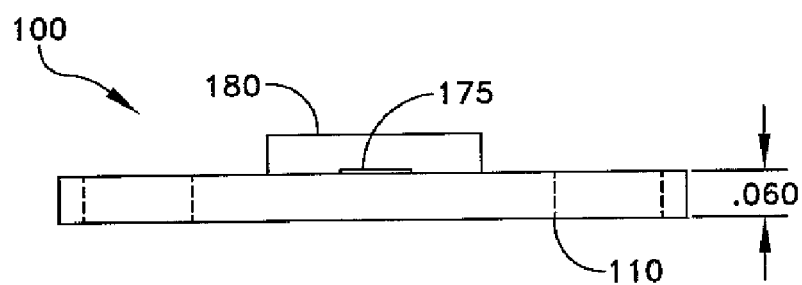

Referring to FIGS. 1A and 1B, there is shown a standard electronic device package configuration 100 having a base 110 which carries or contains one or more electronic modules or chip sets (e.g. electronic semiconductor chip) 175. The chip set is disposed within a protective cover or lid 180 typically formed of or containing a protective ceramic material within a central portion 150 of base 110. In the illustrated embodiment, electrical leads 160, 170 extend transversely to base 110 for providing electrical contact from the chip set to additional circuitry located remote from the package (e.g. on a printed circuit or pc board). Of course, it is understood that multiple additional leads may be included within the package and extending in various angles or directions according to the particular application. It is also understood that the electronic module may include a light emitting diode (LED) or other such optical device in which heat dissipation is a factor, and whereby the package structure may be regarded as an optical RF package, for example. In any event, the base member interposed between the electronic module and the substrate (heat sink) is intended to dissipate heat from the package and thereby maintain device temperature below the maximum allowable temperature specified by the device manufacturer.

Apertures or screw holes 120, 140 are formed on opposite end segments 125, 135 of base 110 for accommodating a bolt or screw for securely attaching to a substrate. As illustrated, the base is of length D and indicated in the figure as 0.744 inches. Note that unless otherwise identified, the dimensions associated with the exemplary embodiments depicted herein are in inches. One problem with the aforementioned package design is that the base is typically made of a metal such a molybdenum, copper or a combination thereof. Such materials are extremely expensive and difficult to machine, particularly with respect to formation of the apertures or holes 120, 140 near the end segments of the base. Furthermore, as discussed above, present package designs are relatively large and are also prone to bowing and lost contact, resulting in device failure and burnout.

According to an aspect of the present invention, an electronic package comprises a base having a reduced length (compared to that of the standard base device package of FIG. 1, for example) and containing a notch defined at each of the ends of the base for engaging a suitably adapted clamping mechanism for securing to a substrate or heat sink. This configuration requires less material (and less cost) than prior designs and enables greater numbers of packages to be disposed within a given area. The clamp mechanism associated with the reduced sized package configuration operates to retain the package on a substrate. A clip may optionally be added to provide centralized pressure on the package cover for further securing the package.

Figure 2A:
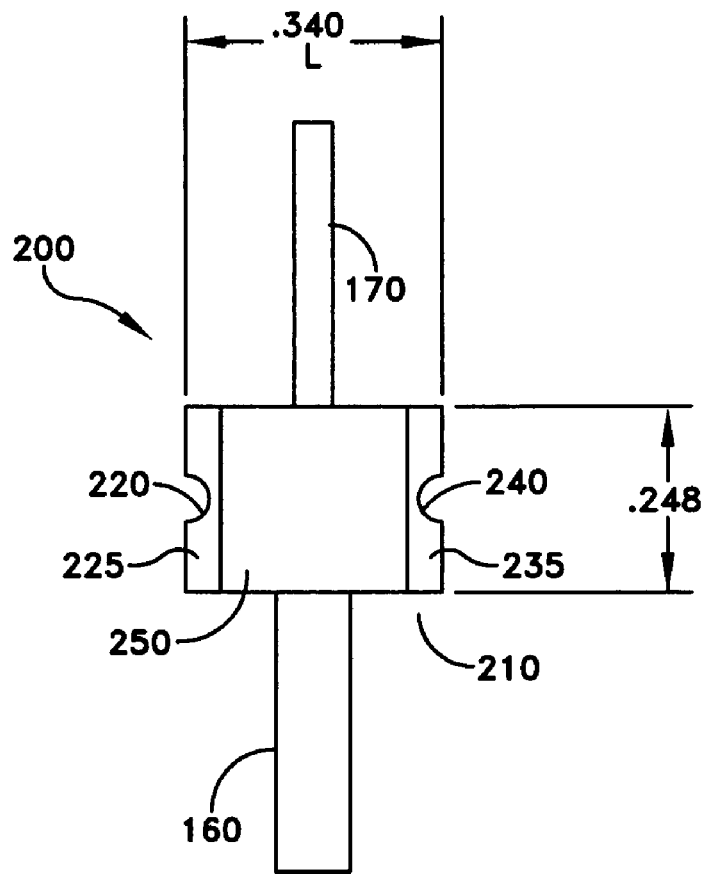
FIG. 2A-B are top and side views, respectively, of a structure similar to that of FIG. 1 but which eliminates the apertures while permitting enhanced heat dissipation according to an embodiment of the present invention.
Figure 2B:
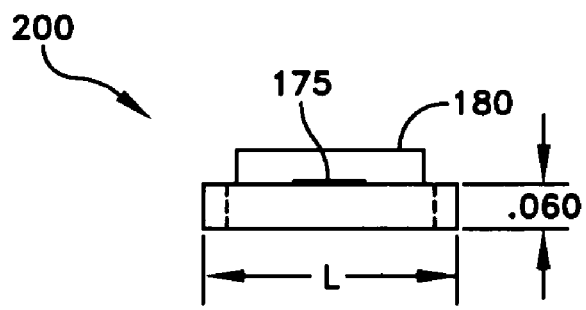

Referring now to FIG. 2A-2B, there is shown an electronic package configuration 200 according to an embodiment of the present invention. Package 200 comprises a flat base 210 having a shortened length L (in comparison to the length D of the standard semiconductor package of FIG. 1A-B) which carries or contains one or more electronic modules or chip sets (e.g. electronic semiconductor chip) 175. The chip set may be disposed within a protective cover or lid 180 typically formed of or containing a protective ceramic or other protective material within a central portion 250 of base 210. In the illustrated embodiment, electrical leads 160, 170 extend transversely to base 210 for providing electrical contact from the chip set to additional circuitry located remote from the package (e.g. on a pc board). Of course, it is understood that multiple additional leads may be included within the package and extending in various angles or directions according to the particular application. Notches 220, 240 are formed at opposite end surfaces 225, 235, respectively, of base 210. In one configuration, each notch is a locking notch having a chamfer on the edge of the end portion of base 210. While the illustrated embodiment shows each notch configured in a semicircular arrangement, other geometrical configurations are contemplated, including for example, a V-shaped, wedge-shaped or other such locking configurations formed on one or more opposite edges of the base 210. In this manner, the holes or apertures illustrated in the standard device package of FIG. 1 are eliminated, resulting in a shorter base and requiring less material than standard device packages. Furthermore, the notches formed at the edge assist in accommodating any thermal expansion mismatch that may occur with the heat sink without bowing or lost contact. In standard device packages having apertures as shown in FIG. 1, thermal expansion problems caused by environmental conditions tend to cause the screws received in apertures 120, 140 (of FIG. 1) to become loosened, resulting in bowing and lost contact. The device package shown in FIG. 2A-B overcomes these difficulties. The base may be made of various types of heat sinking materials, such as metals including molybdenum, copper or a combination thereof, pressed powdered metals, and the like.

Figure 3B:
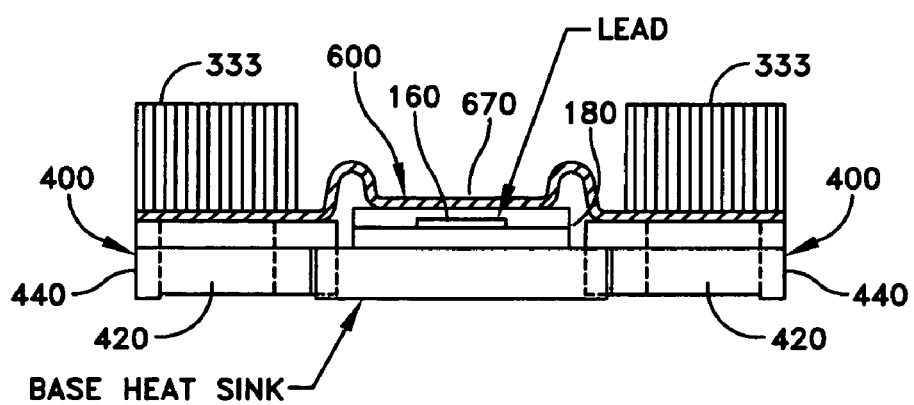
FIG. 3B is a side view of an assembled package structure including a clamping mechanism and pressure clip according to an embodiment of the present invention.
Figure 4A:
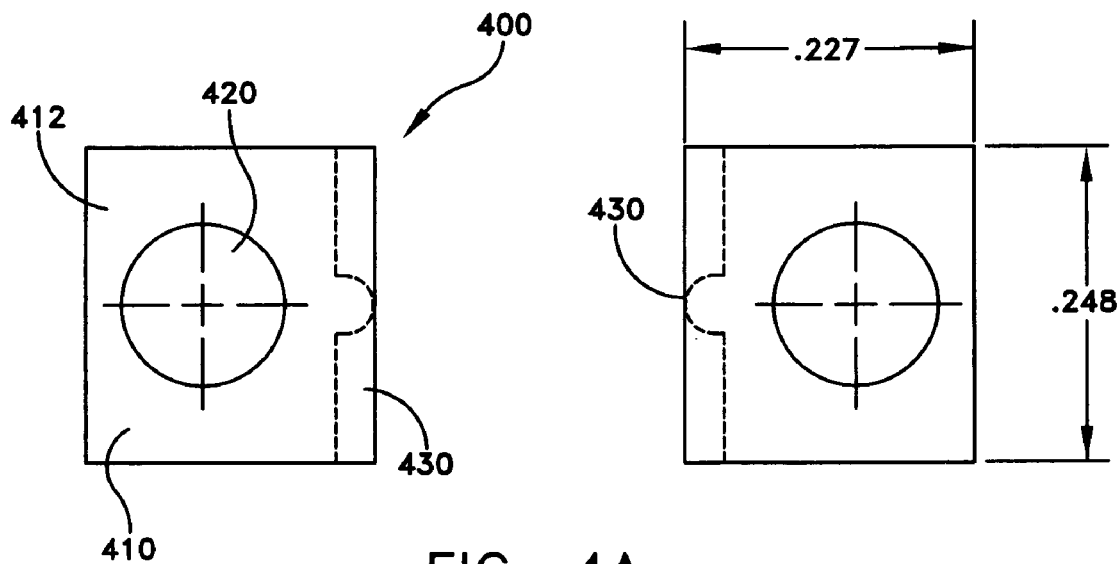
FIGS. 4A, 4B, and 4C are top, side and bottom views of a single sided clamping mechanism according to an embodiment of the present invention.
Figure 4B:
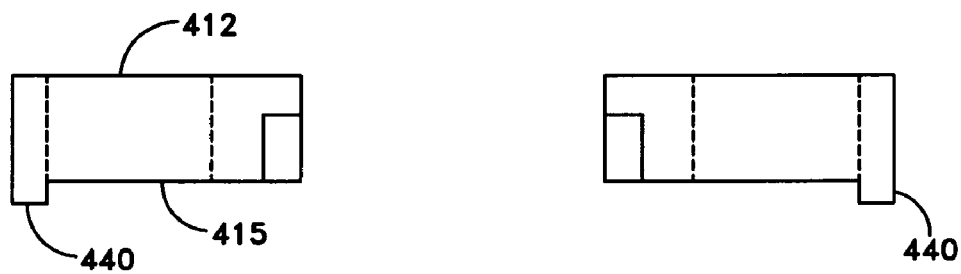
Figure 4C:
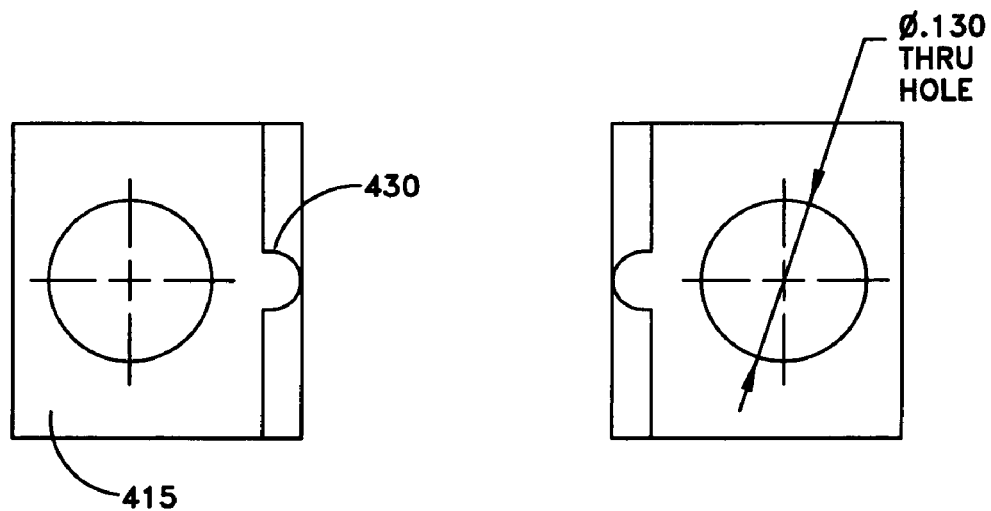

FIGS. 4A-4C illustrate a clamping mechanism 400 for use in conjunction with the package 200 of FIG. 2A-B for securing the package to a substrate such as a printed circuit board. Clamp 400 is illustrated as a single ended clamp and contains a body 410 having formed therein a central aperture 420, a locking boss 430 formed on a first portion of the clamp, and a leveling support 440 formed on a second portion of the clamp opposite the first portion. The clamp operates to centralize the device package and keep it in position. In an exemplary operation, the package 200 is laid down on a printed circuit board and the clamp 400 is aligned with the package with the locking boss 430 sized and configured in mating alignment with a corresponding notch on the package. The central aperture 420 receives a screw or bolt so as to clamp the package in position on the substrate as illustrated in FIG. 3B. Leveling support 440 positioned at the end of clamp 400 prevents the clamp from being tipped downward upon being bolted down or otherwise fastened (e.g. screwed) via aperture 420. The leveling support extends from the top surface 412 (FIG. 4B) below the bottom surface 415 and operates as a pivot to force the top lip of the clamp to pull downward to stay onto the device and maintain a level (rather than an upward angle). The locking boss is configured and dimensioned to matingly align and couple with a corresponding notch (e.g. 220 in FIG. 2) on the package.

The structure can be manufactured using molds and/or die casting processes known in the arts to provide both strong and cost effective mass produced products. While FIGS. 4A-4C illustrate an exemplary geometrical configuration for the locking boss 430, other geometries are also contemplated, including V-shaped, and the like. For example, a plurality of chamfers (e.g. a pair of chamfers on each of the corners of base 210) can be formed on the base package 200 and clamp 400 may include a corresponding set of V shaped wedges formed on the outside to matingly couple with the base and centralize the package. However, manufacturing of such device may result in relatively sharp-edged products, which may not be conducive to mass production. In any event, it is understood that the present invention contemplates various other geometries and interlocking mechanisms for centralizing the package using a novel clamping mechanism as described herein.

Figure 5A:
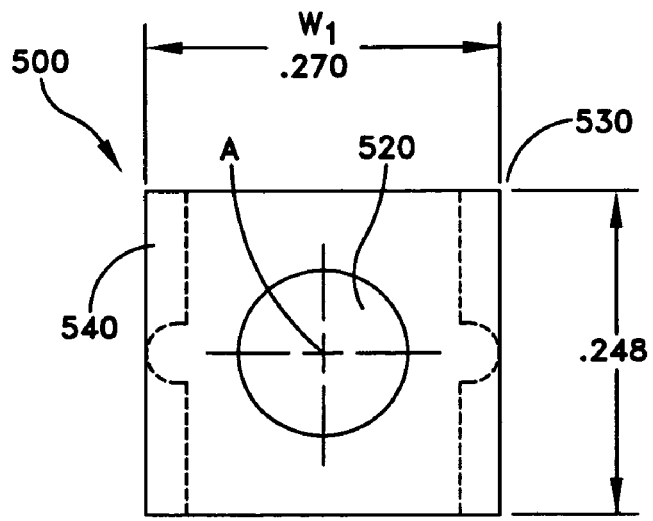
FIGS. 5A, 5B, and 5C are top, side and bottom views of a dual sided clamping mechanism according to an embodiment of the present invention.
Figure 5B:
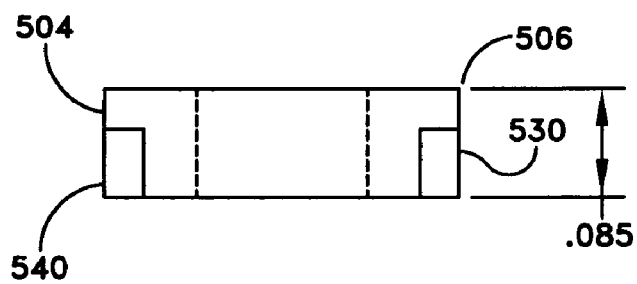

FIG. 5A shows yet another alternative clamp structure 500 similar to that shown in FIG. 4A-C but further comprising a dual ended clamp having dual bosses 530, 540 disposed on opposite ends of the body of clamp 500. While the embodiment shown in FIG. 5A provides a dual ended boss structure, the present invention contemplates a clamp arrangement having multiple bosses (e.g. 3 or 4 bosses) arranged on the various sides of the clamp with corresponding modification to the clamp structure for mating with corresponding multiple (e.g. 3 or more) base packages. As shown in the embodiment of FIG. 5A, the body of clamp 500 has a width w and is preferably symmetrical about its axis as shown in the drawing. A central aperture 520 is formed within the body of clamp 500. This clamp structure enables each boss (530, 540) to cooperatively engage or mate with a corresponding different package at its respective opposite end 504, 506 (FIG. 5B) while securing to the substrate via aperture 520.

Figure 3A:
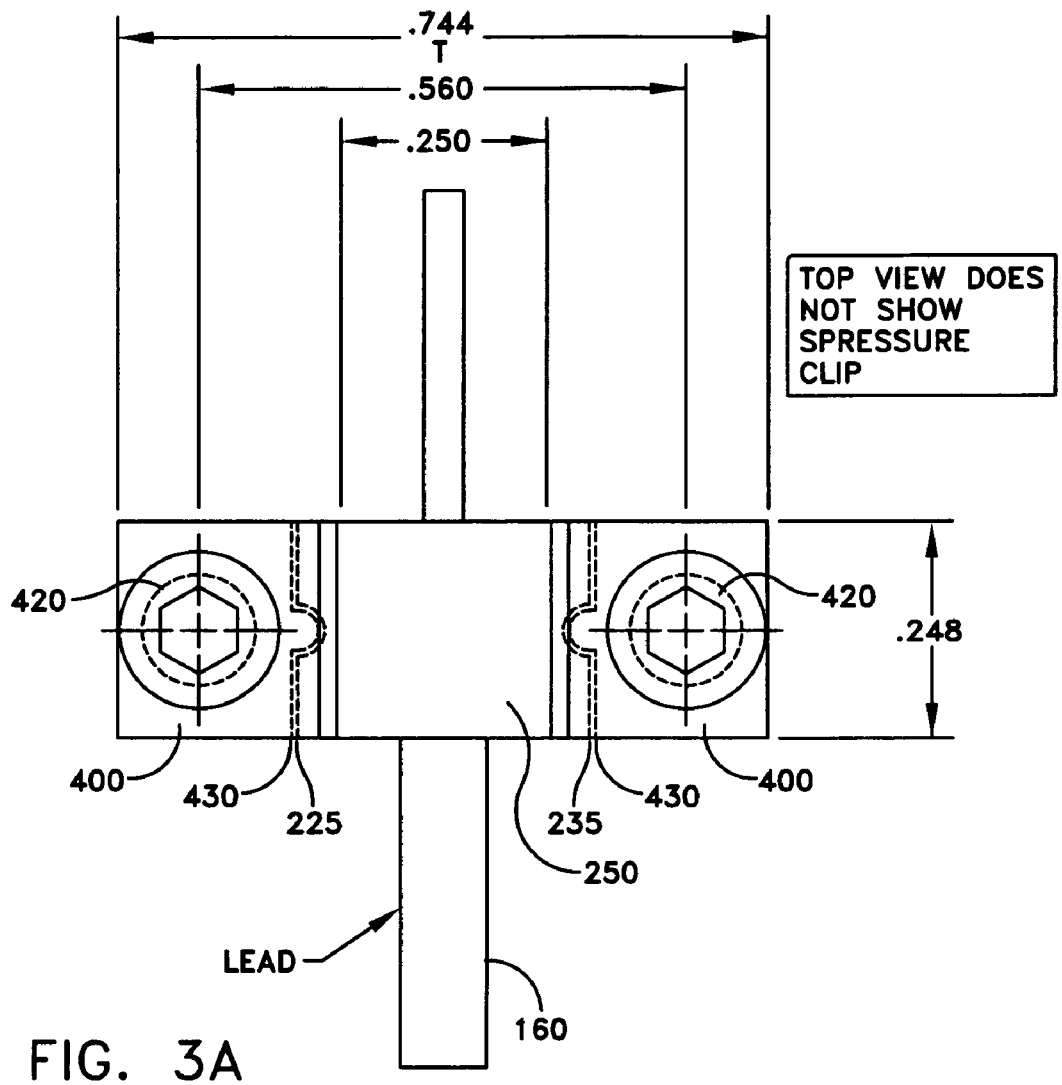
FIG. 3A is a top view of an assembled package structure including a clamping mechanism according to an embodiment of the present invention.

FIG. 3A is a top view of an assembled package structure 300 that incorporates the reduced base package configuration 200 (FIG. 2) and includes a pair of single ended clamps 400 matingly adapted at each end of base 200. Like reference numerals are used to indicate like parts. As shown, the overall length of the structure having a base of reduced length may be identical to that of the standardized package length D of FIG. 1, thereby enabling direct replacement within existing configurations.

FIG. 3B illustrates a side view of the assembled package structure 300 of FIG. 3A, but further including a resilient spring or pressure clip 600 having a planar central area 670 adapted to provide pressure onto the cover 180 at the center of the package for providing more uniform contact with a substrate for dissipating heat. A pair of screws 333 are disposed on opposite ends of the package and are received in corresponding aligning apertures within the clip 600 and clamps 400 for securing to a substrate.

Figure 6A:
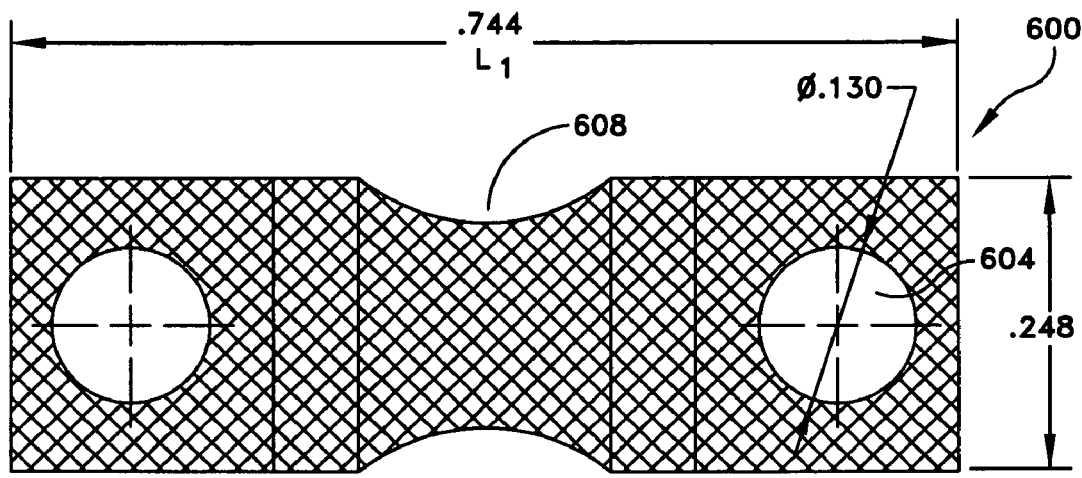
FIG. 6A-B represent top and side views, respectively, of a pressure clip according to an embodiment of the present invention.
Figure 6B:
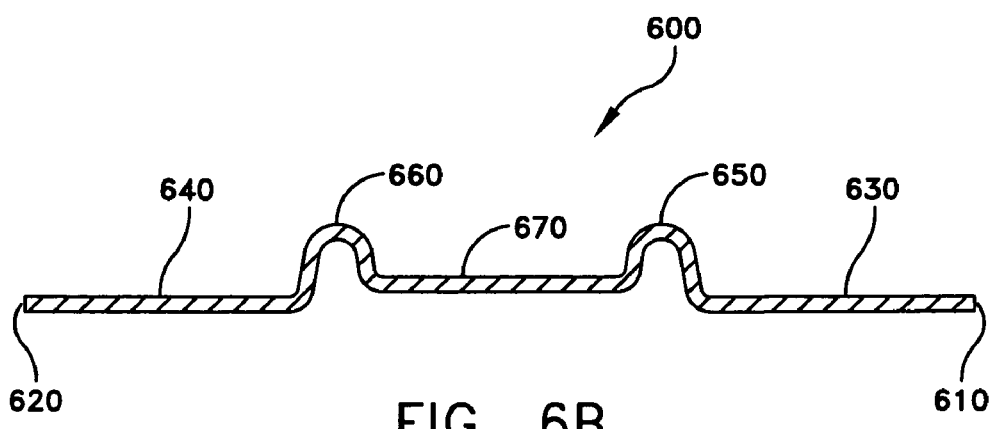

According to another aspect of the present invention, there is shown in FIG. 6A-B an exemplary embodiment of clip 600 shown in FIG. 3B for use with either the standard package design illustrated in FIG. 1 or the package structure of FIG. 2 (in conjunction with the clamping mechanism 400 utilized with the structure of FIG. 2). It is understood that the size and dimensions of clip 600 will vary according to the particular application (e.g. taking into account the size and spacing of different packages, length and width of the package, the structure of the central ceramic cover, such as single or double protuberances, etc.).

As shown in the top view embodiment of FIG. 6A, clamp 600 includes apertures 602, 604 for receiving bolts or screws (see FIG. 3) for securely fastening to the base or ground plane. As further shown in the top view embodiment of FIG. 6A, central portion 608 is shown as a concave section to provide clearance for the electrical leads. It is understood, however, that such configuration may be formed in various other geometries, such as rectangular clearance, no clearance (if such is unnecessary) or an exact difference so as to enable the difference between the air gap and the ground plane to be impedance matched to the particular device.

As shown in the side view embodiment of FIG. 6B, clip 600 includes a pair of spaced apart protuberances 650, 660 disposed from ends 610, 620, and extending in a generally vertical direction from the planar connecting end segments 630, 640 of the clip. Planar centralized segment 670 is disposed between protuberances 650, 660 for providing centralized pressure via the protuberances to the package (see FIG. 3) about a substantial portion of the top surface of the package cover 180. As illustrated, centralized segment 670 is elevated from end segments 630, 640 according to the requirements of the particular package to which the clip is applied. Clip 600 is preferably formed as a monolithic device made of sufficiently sturdy and resilient material that is compatible with the composition and electrical characteristics of the electronic package.

Figure 7A:
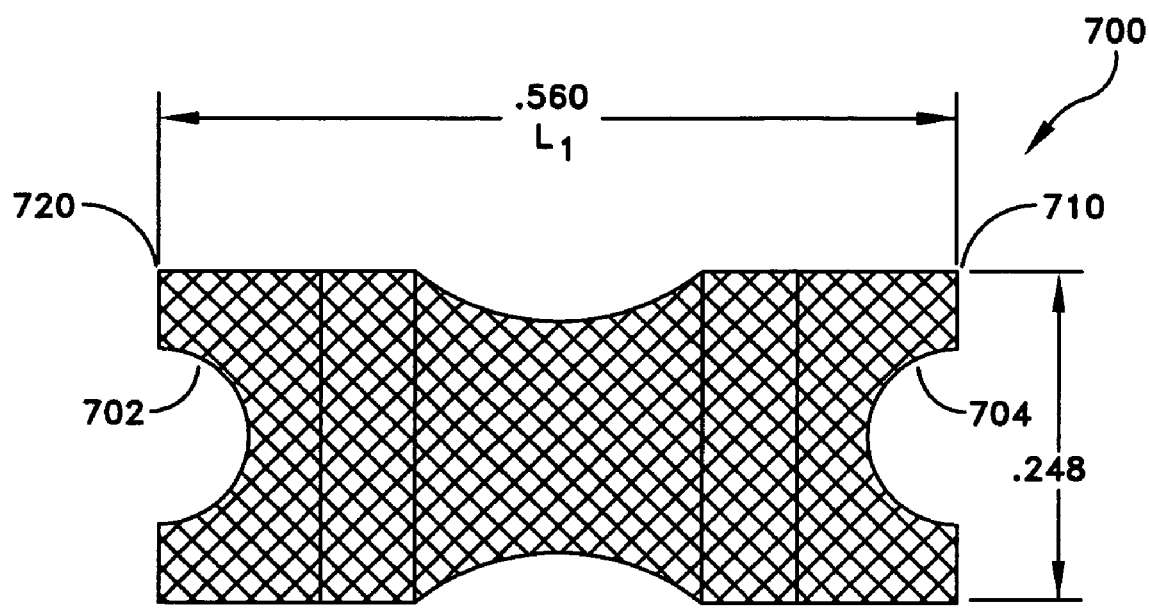
FIG. 7A-B represent top and side views, respectively, of a pressure clip according to another embodiment of the present invention.
Figure 7B:
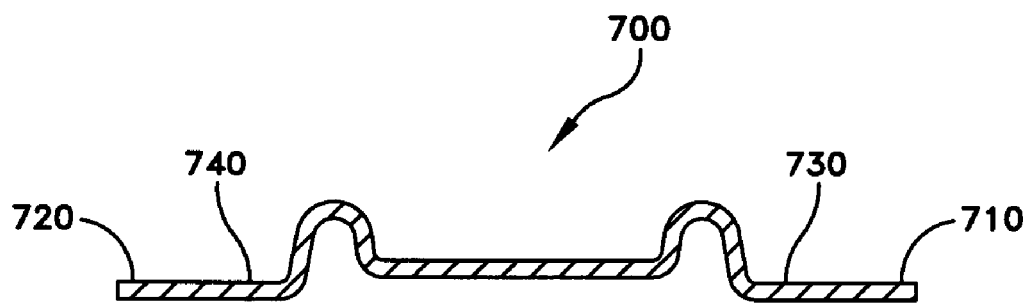

FIGS. 7A-B illustrate an alternative embodiment of the clip design shown in FIG. 6A-B wherein the through holes or apertures 602, 604 shown in FIG. 6A have been eliminated, and wherein semicircular notches 702, 704 are formed at the respective ends 710, 720 of the clip. Elimination of the through holes or apertures reduces the length of end segments 730, 740 in comparison to end segments 630, 640 in the embodiment illustrated in FIG. 6, and hence reduces the overall length $L_1$ of the clip (relative to the clip embodiment of FIG. 6). The clip may be suitable for use with the package structure of FIG. 2 (in conjunction with the dual ended clamping mechanism 500 of length $w_1$ to be utilized with the base structure of FIG. 2). This arrangement enables another like configured clip to be concatenated or disposed adjacent an end 710, 720 of clip 700, so that the semicircular notch (e.g. 704) formed at the end of each of the clips together form a single aperture aligned with the aperture 520 of clamp 500 through which a central bolt may be provided to secure the two clips using the formed single aperture. This enables formation of a greater number of packages within a given area.

Figure 5C:
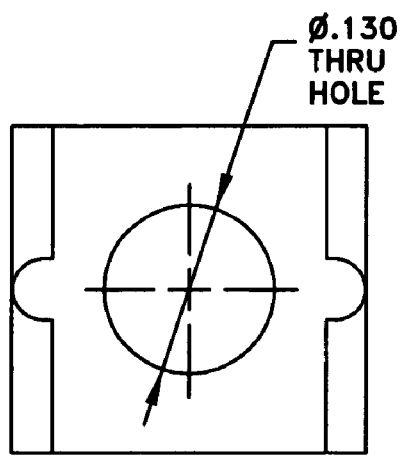
Figure 8A:
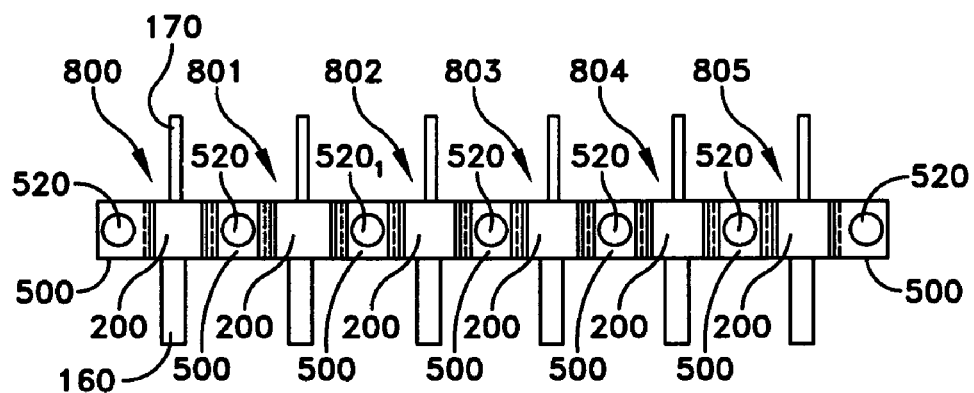
FIG. 8A is an exemplary illustration of a package layout comprising a plurality of individual packages assembled on a board and having reduced length according to an embodiment of the present invention.
Figure 8B:
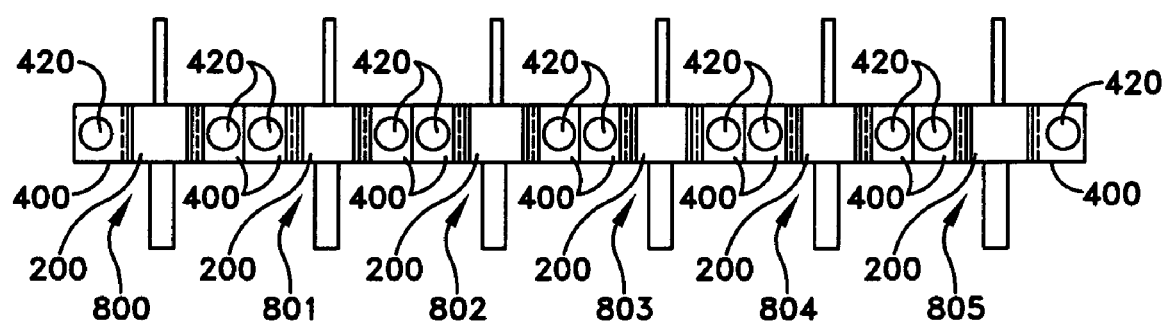
FIG. 8B is an exemplary illustration of another package layout comprising a plurality of individual packages assembled on a board in a standard package configuration.

FIG. 8A illustrates a layout for a plurality of packages 800, 801, 802, 803, 804, 805 formed with the shortened base package 200, dual ended clamp mechanism 500 and optional clip arrangement 700 as depicted in the embodiments of FIGS. 2, 5 and 7, respectively. As shown, the package layout of FIG. 8A enables a greater package density, since each central hole or aperture 520 receives a bolt or screw that holds together two adjacent packages (e.g. a bolt received in common aperture $520_1$ couples and holds together adjacent packages 802 and 803). By comparison, FIG. 8B illustrates the design arrangement wherein the plurality of packages 800, 801, 802, 803, 804, 805 are formed without using the shortened arrangement depicted in the component embodiments of FIGS. 2, 5 and 7. Instead, the layout of FIG. 8B may be formed in accordance with the standard design package shown in FIG. 1 or using the base structure embodied in FIG. 2 along with the single ended clamp mechanism 400 and optional clip arrangement 600 as depicted in the embodiments of FIGS. 4 and 6, respectively. As shown in the embodiment of FIG. 8B, two bolts are required for securing each package (e.g. bolts for each of apertures $420_1$ and $420_2$ for package 801) with no overlap between packages.

For certain applications where space requirements are a significant factor, the design assembly and layout exemplified in FIG. 8A represents a considerable improvement over the standard arrangements and layouts presently in use. For example, telecommunications tower design and cabling requirements for maintaining the hardware packages in a unit remote from the horns may be eliminated, since the smaller sized packages may now be placed within a sufficiently small enclosure co-located with the horn on the tower and connected thereto via a relatively short length of cable. In any event, the present design illustrated in FIG. 8A provides for greater package density, enabling smaller enclosure units within a given space with more equipment and processing capabilities.

It is further understood that the detailed dimensions provided herein are exemplary of particular embodiments, and that various other dimensions and sizes may be accommodated according to the particular application.

It will be apparent to those skilled in the art that modifications and variations may be made in the apparatus and process of the present invention without departing from the spirit or scope of the invention. Other advantages and aspects of the present invention may be discerned by one skilled in the art and all such alternatives or other embodiments are contemplated to be accommodated by the scope of the present invention.

What is claimed is:

1. An electronic device package assembly for coupling to a substrate to dissipate heat comprising:
    a base member having a first surface adapted to carry an electronic module, a second surface opposite said first surface for engaging the substrate, and first and second opposing ends, each said end defining a corresponding notch therein;
    a first clamp having a body and a first end adapted to matingly couple to one said corresponding notch; and
    a second clamp having a body and a first end adapted to matingly couple to the other said corresponding notch;
    wherein each of said first and second clamps includes a through hole formed in said body adapted to receive a fastener for securing the base member to the substrate.

2. The package assembly of claim 1, further comprising a protective cover disposed over said electronic module.

3. The package assembly of claim 2, further comprising a spring clip coupled to said first and second clamps and having a central planar segment disposed over said protective cover for providing centralized pressure thereto.

4. The package assembly of claim 3, wherein said spring clip is monolithic and comprises a pair of oppositely disposed and laterally extending legs, each leg coupled to said central planar segment by a corresponding protuberance, wherein said laterally extending legs each include a through hole or portion thereof alignable with a corresponding one of the through holes in the substrate for receiving said fastener for securing said spring clip.

5. The package assembly of claim 1, wherein each said notch of said planar base member includes a chamfered edge for engaging a corresponding locking boss on one of said first and second clamps.

6. The package assembly of claim 1, wherein each said notch comprises one of a semicircular, V, and wedge shaped notch, and wherein each said through hole of said first and second clamps is aligned with a corresponding through hole in the substrate for securing to the substrate via said fastener.

7. The package assembly of claim 1, wherein said base comprises a metal.

8. The package assembly of claim 7, wherein said base is one of molybdenum, copper or a combination thereof.

9. The package assembly of claim 7, wherein said base is a press powdered metal.

10. The package assembly of claim 1, wherein said substrate comprises a heat sink, and wherein said first and second clamps each include a leveling support extending below a bottom surface for reducing angular offset of said base member and said heat sink.

11. The package assembly of claim 1, wherein said first clamp further includes a second end opposite said first end and adapted to matingly couple to a corresponding notch of another base member.

12. The package assembly of claim 1, further comprising a plurality of base members and a plurality of first and second clamps, wherein each base member is disposed between a corresponding first and a second clamp in a row like configuration.

13. The package assembly of claim 12, wherein interposed between two successive base members is a single one of said first clamp or said second clamp.

14. The package assembly of claim 12, wherein interposed between two successive base members is one of said first clamp and one of said second clamp.

15. The package assembly of claim 12, wherein each of said plurality of base members are identical and each of said plurality of first and second clamps are identical.

16. The package assembly of claim 1, wherein said electronic module comprises a semiconductor circuit.

17. The package assembly of claim 1, wherein said electronic module comprises a light emitting diode.

18. An electronic device package for coupling to a substrate to dissipate heat comprising:
a base member having a first surface adapted to carry an electronic module, a second surface opposite said first surface for engaging the substrate, and first and second opposing ends extending along a first axis, each said end defining a corresponding notch therein,
wherein each said notch is adapted to mechanically engage a corresponding boss of a clamp at a clamp end thereof, said corresponding clamp having a through hole in alignment with a corresponding through hole of said substrate, the clamp through hole adapted to receive a fastener for securing the base member to the substrate.

19. The device package of claim 18, wherein leads extend from said base member in a direction transverse to said first axis of said base member.

20. The device package of claim 18, further comprising a protective cover disposed over said electronic module, and a spring clip having a central planar segment disposed over said protective cover for providing centralized pressure thereto, said spring clip being coupled to said substrate via said through hole in said substrate.

* * * * *